METHOD OF MAKING THIN LAYER SEMICONDUCTOR DEVICES

Filed Aug. 3, 1959 3 Sheets-Sheet 1

INVENTORS.
BARRY T. FRENCH,
EDWARD M. NAKAJI,
STANLEY SCHNEIDER
BY THEIR ATTORNEYS
HARRIS, KIECH, RUSSELL & KERN

INVENTORS.
BARRY T. FRENCH,
EDWARD M. NAKAJI,
STANLEY SCHNEIDER
BY THEIR ATTORNEYS
HARRIS, KIECH, RUSSELL & KERN

METHOD OF MAKING THIN LAYER SEMICONDUCTOR DEVICES

Filed Aug. 3, 1959 3 Sheets-Sheet 3

INVENTORS.
BARRY T. FRENCH,
EDWARD M. NAKAJI,
STANLEY SCHNEIDER
BY THEIR ATTORNEYS
HARRIS, KIECH, RUSSELL & KERN 3,082,124

METHOD OF MAKING THIN LAYER SEMICONDUCTOR DEVICES

Barry T. French, Costa Mesa, Edward M. Nakaji, Torrance, and Stanley Schneider, Costa Mesa, Calif., assignors to Beckman Instruments, Inc., a corporation of California Filed Aug. 3, 1959, Ser. No. 831,192
18 Claims. (Cl. 117—211)

This invention relates to magnetoresistivity and, in particular, to such devices having a high magnetoresistive and Hall voltage effect and to methods for making such devices.

Magnetoresistivity relates to the change in electrical resistance of a material as a function of changes in the magnetic field applied to the material. Magnetoresistive characteristics are exhibited by a variety of materials including germanium, silicon, lead sulfide, bismuth, indium arsenide and indium antimonide. A high magnetoresistivity, i.e. a large change in resistance for a given change in magnetic field, appears to be directly related to the electron mobility of the material. While various materials may be used to produce magnetoresistive devices, the intermetallic compounds indium antimonide and indium arsenide have far greater electron mobilities and exhibit much larger magnetoresistive effects than the other materials which have been tested. For this reason, most of the work in this field has been conducted with indium antimonide and indium arsenide, the former having a higher magnetoresistive effect while the latter has a higher intrinsic resistance.

In order to produce a device which is useful in an electrical circuit, the magnetoresistive material must be utilized in a very thin layer so that the resultant device will have a sufficiently large resistance. Various methods have been used in an attempt to produce suitable magnetoresistive devices. For example, a large block of material exhibiting high magnetoresistive characteristics is sliced or ground to produce a thin section. Since the section is in the order of a few thousandths of an inch thick, the mechanics of grinding or slicing become extremely complex and the resultant material is quite fragile. In another method of forming a thin film, the magnetoresistive material was ground, mixed with a suitable solvent, and silk-screened onto a base plate. This method was unsuccessful as the resultant film had negligible magnetoresistance, the characteristics of the starting material being lost during the process. Thin films were also produced by vapor plating wherein the material exhibiting high magnetoresistivity is vaporized in a vacuum and condensed on a substrate or surface of a base plate as a film. However, the conventional vapor plating techniques also failed to produce a magnetoresistive film, this desirable characteristic of the initial material being somehow destroyed in the process.

Accordingly, it is an object of the invention to provide a method of making a device having a thin film of material exhibiting a high magnetoresistance and Hall voltage effect. It has been found that a highly magnetoresistive device can be produced by vapor depositing a magnetoresistive material onto a substrate using certain techniques which produce the desired though unexpected result.

It is an object of the invention to provide a method of making devices having high magnetoresistance, including the steps of heating a base plate in a zone of reduced pressure to an elevated temperature, evaporating a quantity of material having high magnetoresistance in bulk form, the material being evaporated in the reduced pressure zone over a period of time, condensing the vaporized material on the base plate, raising the temperature of the base plate during the evaporating and condensing period, and then cooling the film coated plate. It has been found that devices made by this method unexpectedly exhibit magnetoresistance of the order of that of the bulk material used in making the device. A further object of the invention is to provide a method in which a quantity of a highly magnetoresistive intermetallic compound is vaporized and in which the elements of the compound condense on the substrate, some of these elements recombining to form the compound so that the resultant film comprises a mixture of the compound and the elements of the compound.

It is an object of the invention to provide a method wherein particles of a highly magnetoresistive intermetallic compound such as indium antimonide are individually and successively flash evaporated at a point spaced from a substrate and subsequently the vaporized elements are condensed on the substrate in a thin, crystalline film. A further object is to provide a device made by the method of the invention having a solid solution of the intermetallic compound and each of the elements of the compound.

The invention will be described in detail with particular reference to indium antimonide, since this material exhibits a magnetoresistive effect in bulk superior to other known materials. The method and apparatus described and illustrated herein are exemplary of the invention and also disclose other objects, advantages, features and results thereof.

Figures 1, 4, 5, 6, 7, 8:
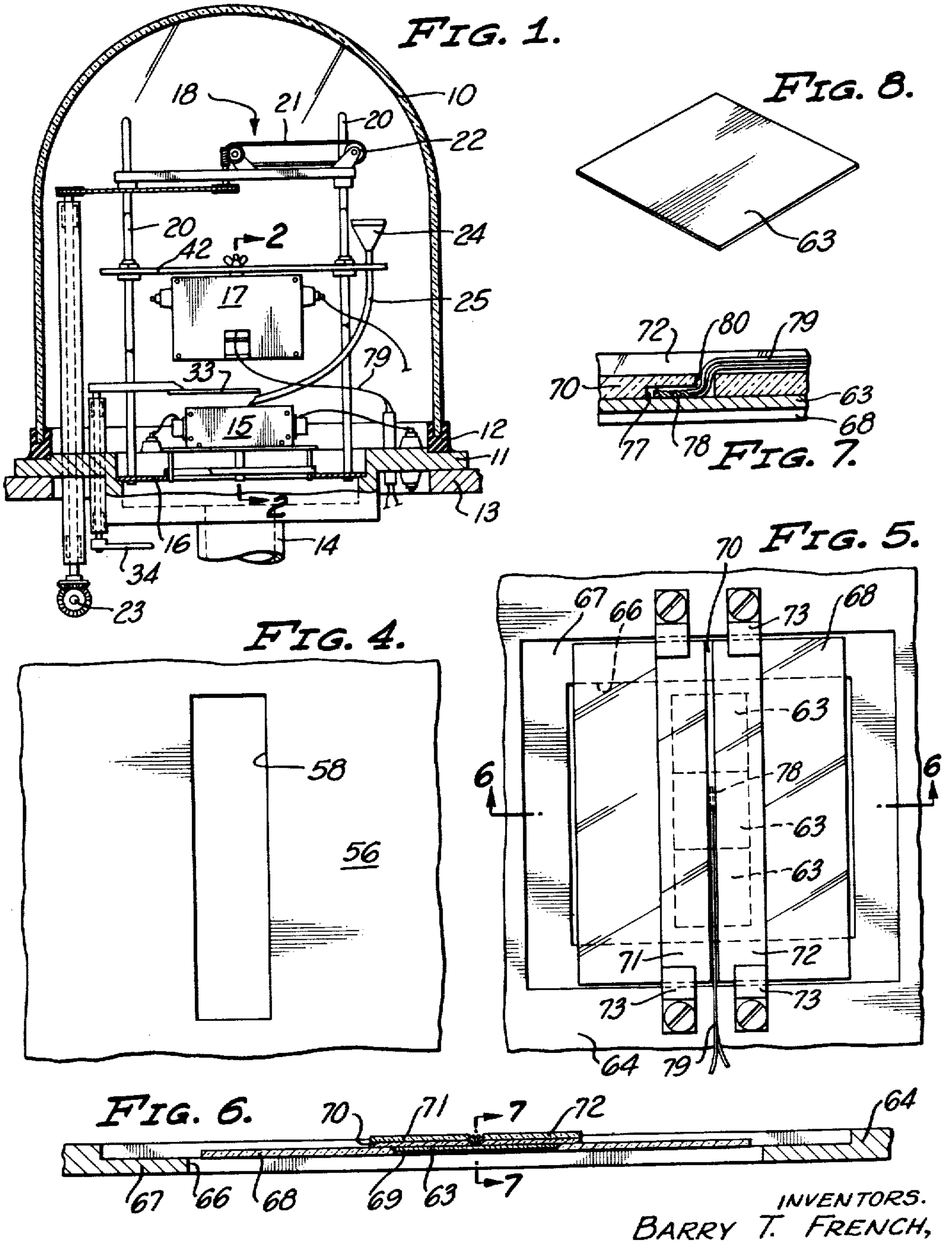
FIG. 1 is a sectional view of a preferred apparatus for carrying out the method of the invention.
FIG. 4 is a view taken along the line 4—4 of FIG. 3.
FIG. 5 is a view taken along the line 5—5 of FIG. 3.
FIG. 6 is an enlarged sectional view taken along the line 6—6 of FIG. 5.
FIG. 7 is an enlarged sectional view taken along the line 7—7 of FIG. 6.
FIG. 8 is a perspective view of a typical magnetoresistive device produced by the method of the invention.
Figure 2:
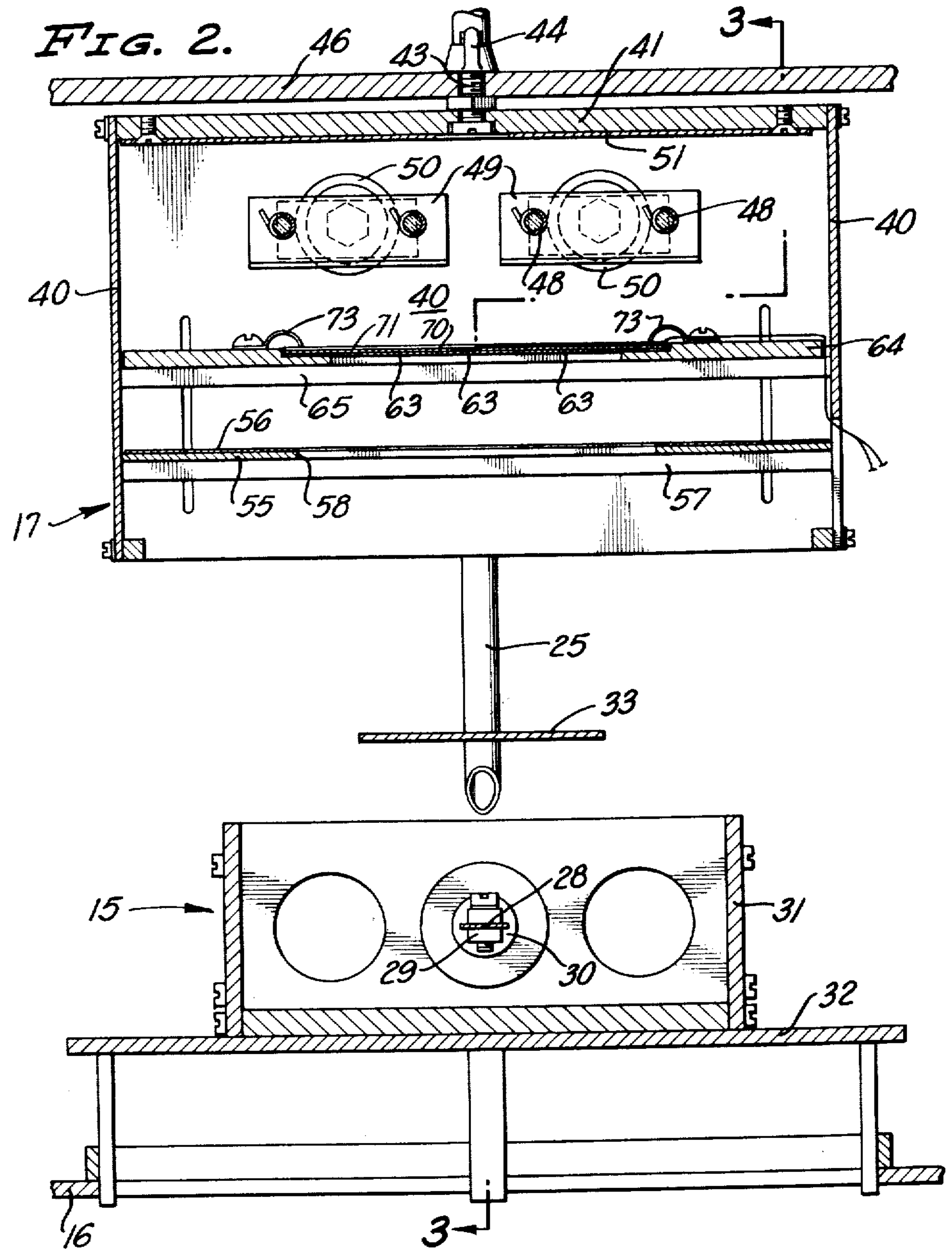
FIG. 2 is an enlarged sectional view taken along the line 2—2 of FIG. 1.
Figure 3:
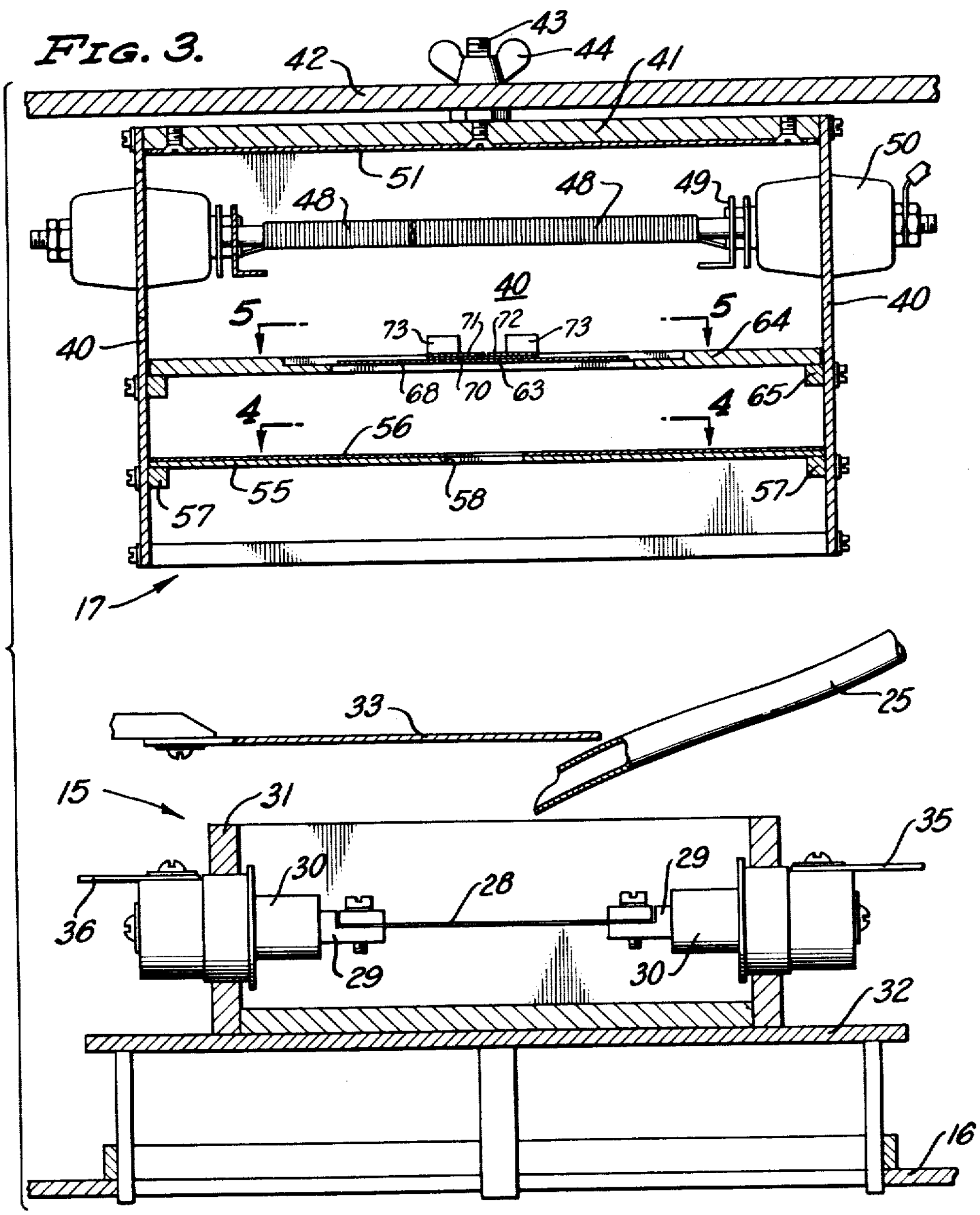
FIG. 3 is a sectional view taken along the line 3—3 of FIG. 2.

In the method of the invention, the magnetoresistive material is evaporated and deposited on a heated base plate or substrate. The operation is carried out in a vacuum and the material is preferably flash evaporated in small quantities over a period of time. This procedure produces a minimum contamination of the material and provides a uniform mixture of the elements of the compound in the vapor and the subsequently condensed film. The material, such as indium antimonide, which exhibits a high magnetoresistance effect in bulk form, may be ground to fine particles and dropped onto a heated strip a particle at a time, with each particle being vaporized immediately upon contact with the strip.

The substrate on which the vapor is condensed is the surface of a nonconductor, such as a glass or ceramic plate. This plate is heated to a predetermined temperature prior to vaporizing the material, with the heated plate spaced from the vapor source a distance less than the mean free path of the atoms and/or molecules emanating from the source, i.e., the heated strip. In air at a pressure of $10^{-4}$ mm. of mercury, the mean free path is approximately 50 centimeters. In such a reduced pressure zone, the molecules and/or atoms in the vapor will travel in a straight line at high velocity and plate or condense on any surface exposed to the source.

During the vaporizing operation, which ordinarily consumes several minutes, the temperature of the base plate is increased, preferably in the order of 25° C. above the stabilized temperature existing at the start of vaporization. It has been found that this temperature increase is essential in the production of films having high magnetoresistance and Hall voltage effect. When the base temperature is maintained constant during the vaporizing and condensing, the resulting film exhibits a magnetoresistance of less than 5%, whereas when the base temperature is increased as taught by the invention, the magnetoresistance of the resulting film approaches that of the material in bulk. Heat is added to the base plate by the heat of reaction of the separated atoms and/or molecules of the vaporized material as some of them recombine to form the initial compound. Heat is also added to the base due to the heat of condensation of the vaporized material as it condenses onto the substrate. The base plate is ordinarily heated to its initial elevated temperature by a heat source positioned adjacent the surface of the plate opposite that on which the film is to be formed. As the film forms, heat is added to the base due to absorption of energy radiated from the heat source and reflected back through the plate from the opaque film. The exact temperature rise of the base during the vaporizing operation may be controlled by increasing or decreasing the amount of heat radiated from the heat source during the period of time in which the material is fed to the vaporizing device. Since the heat source is ordinarily an electrical resistance heater, the radiated energy is easily controlled.

When all of the material has been evaporated, the source of heat for the vaporizer and the source of heat for the base plate are de-energized and the film covered plate is permitted to cool. The device is then ready for use in the same manner as conventional magnetoresistive devices. When desired, conducting electrodes may be formed on the film to serve as shorting electrodes for the Hall voltage and increase the magnetoresistance of the device.

The action occurring on the substrate during the condensation and recombination which results in the desired high magnetoresistivity is not fully understood at this time. One reason for this is the difficulty in obtaining exact information as to what actually takes place. The film is very thin, in the order of several microns, which prevents adequate physical observation of the film formation. The introduction of thermocouples and other measuring instruments into the film or onto the substrate where the film is formed is prohibited because the instruments are of a size to seriously affect the operation, acting as local heat sinks and introducing contaminants into the film.

However, it is presently quite well settled that the intermetallic compound is separated into its elements when vaporized and the individual atoms and/or molecules travel to the substrate. The substrate is heated to an elevated temperature, ordinarily slightly below the melting temperature of the compound and, on arrival at this surface, a portion of the elements recombine to form crystals of the compound on the substrate. The condensation and recombination at the film surface produce a hot zone maintaining the exposed face of the film in molten condition as the film grows in thickness. Additional heat for maintaining this condition may be supplied by the electric heater. The resultant film is a solid solution of the intermetallic compound crystals and the separate elements thereof.

A preferred form of apparatus for carrying out the method of the invention is shown in the drawings. A bell jar 10 is mounted on a base 11 with a seal ring 12 therebetween, with the base resting on an apertured support table 13. A conduit 14 provides communication with the interior of the bell jar for producing the desired vacuum therein. A vaporizer unit 15 is supported on a plate 16 carried on the base 11 and an oven unit 17 and a feed unit 18 are carried on rods 20 extending vertically upward from the plate 16.

The feed unit 18 is adapted to deliver the magnetoresistive material to the vaporizer unit in discrete quantities at the desired rate. In the preferred embodiment illustrated herein, a belt 21 is supported on rollers 22 and is driven in a clockwise direction by a conventional gear and chain arrangement from a shaft 23 externally of the bell jar. In practicing the invention, the particles of the magnetoresistive material are arranged on the belt 21 so that when the shaft 23 is actuated, the particles will fall, preferably one at a time, into a funnel 24 and through a delivery tube 25 to the vaporizer unit 15.

The vaporizer unit 15 provides a source of heat for evaporating the magnetoresistive material. It is desirable that the unit be capable of vaporizing each particle substantially instantaneously on contact with the unit and also that the unit introduce no contaminants into the vapor. The heat source for the vaporizer unit may comprise a molybdenum strip or filament 28 heated by an electric current therein. The strip shown in the drawings is about 2" long, ⅜" wide and 0.005" thick and is clamped between mounting brackets 29 carried in insulating bushings 30 mounted in the wall 31 of the unit. The unit rests on a baffle plate 32 which protects the inlet to the conduit 14. Another baffle plate 33 is positioned above the strip 28 and is pivotally mounted in the base 11 for external actuation by a lever 34, this plate providing protection for the strip when the apparatus is not in use. Current is supplied to the strip 28 through conductors 35, 36 which pass through the base 11 by means of conventional insulating feedthroughs.

The oven unit 17 has four sides 40 and a top 41 and is removably supported from a plate 42 by a screw 43 and wing nut 44.

Four electrical resistance heaters 48 are mounted horizontally in the oven unit on brackets 49 supported by insulating bushings 50. Feedthrough conductors are also provided in the base 11 for connecting the heaters to an outside power source. A reflector plate 51 of stainless steel or similar material may be provided on the under surface of the top 41 for reflecting radiation from the heaters downwardly.

Another plate 55 may be disposed horizontally in the oven adjacent the lower portion thereof, this plate preferably having a layer of reflecting material such as aluminum foil 56 on the upper surface thereof. The plate 55 may be carried on brackets 57 fastened to the walls 40 of the oven, the brackets preferably being movable vertically for varying the position of the plate 55 relative to the heaters 48. An aperture 58 corresponding substantially in shape to the film to be applied to the substrate is provided in the plate 55 and foil 56. Thus, the plate 55 screens out those atoms and/or molecules of vapor which would not impinge on the substrate and also provides a maximum reflecting surface.

In the embodiment illustrated herein, the magnetoresistive material is applied to a glass microscope slide 63, such as is shown in FIG. 8. The apparatus provides for coating three such slides at a time, the slides being held in a slide support plate 64 in turn carried on brackets 65 which are movable vertically for varying the position of the slides relative to the heaters.

The support plate 64 has an aperture 66 therein bordered by a shoulder 67. A plate 68 rests on the shoulder 67 spanning the aperture 66. An opening 69 in the plate 68 is provided with converging sides, as seen best in FIG. 6, for receiving the slides 63. Three slides 63 are positioned in the opening 69 and are covered by a plate 70 which in turn is covered by two parallel spaced plates 71, 72, the plates and slides being clamped in position by spring clips 73. The plates 68, 70, 71 and 72 are ordinarily made of glass.

A recess 77 is provided in the lower surface of the plate 70 for receiving a thermocouple 78, the thermocouple wires 79 passing upward through an opening 80 in the plate 70 and radially outward between the spaced plates 71, 72 (FIG. 7). The wires 79 are fed to an externally located indicating instrument through a pair of feedthrough conductors in the base 11. The thermocouple 78 is positioned in contact with the upper surface of one of the slides 63 to provide an indication of the temperature of the base plate.

The particular construction and arrangement of the vaporizer and oven units illustrated herein produce the desired temperature conditions for carrying out the method of the invention. It has been found that the sizes and locations of the various elements affect to some extent the temperatures, the temperature changes and the resulting magnetoresistivity. The particular apparatus illustrated herein was used in carrying out the example of the method to be given in detail hereinafter and has been drawn substantially to scale. As an indication of the relative sizes of the components, the slide holder 64 is positioned with its opening 69 vertically above the strip 28 a distance of four inches, the heaters 48 are ⅞" above the slide holder and the reflector 56 is 1¼" below the slide holder.

A specific example of the method of the invention follows: Indium antimonide with an n-type impurity concentration of $1\times10^{18}/\text{cm.}^3$ at −196° C., an electron mobility of 40,000 $\text{cm.}^2$/volt-sec. at 27° C., and resistivity of .00015 to .003 ohm-cm. at 27° C. was used. This is a commercially available semiconductor material having high magnetoresistivity. The increase in resistance of this material in bulk in a field of 4700 gausses is in the order of 170%. One gram of the material was prepared as grains with a particle size in the range of 1000–2000 microns in diameter. Smaller or larger size particles can be used; however, the temperature of the vaporizing filament should be lowered when smaller size particles are used and increased when larger size particles are used. The particles of material are arranged on the belt 21 of the feed unit so that the grains will fall one at a time onto the heater strip.

The slides 63 are 18 mm. square glass microscope slides 0.17 mm. thick. The slides and the glass slide holder parts are cleaned by rinsing in concentrated nitric acid, rinsing in water and drying. The slides are mounted in the slide holder as shown in the drawing with an iron-constantan thermocouple.

The oven is mounted in the apparatus as described above, the bell jar is placed over the apparatus and the pressure within the bell jar is lowered to not exceed $3\times10^{-4}$ mm. of mercury. The heaters 48 are energized and the current is controlled to raise the temperature of the slides to about 500° C., as indicated by the thermocouple contacting the upper surface of a slide. The melting point of the indium antimonide is 525° C. The temperature of the slides is stabilized, preferably at 500° C. and within the range of 470–530° C.

The plate 33 is swung out of position over the molybdenum strip 28 and the power source is connected to the strip. This particular strip requires about 150 amperes at 5 volts and is raised to a temperature of 1100–1300° C. If the strip is stabilized at a temperature below this range, the material will not evaporate readily and if at a temperature above this range, the material will have a tendency to come off in large globules or partially melted particles. As indicated above, the temperature of the vaporizing strip should be changed when the particle size is changed.

After the heaters 48 and the filament 28 have stabilized at the desired temperatures, the feed unit is actuated to feed the gram of material to the vaporizer in three minutes. During this 3-minute period, the temperature of the glass slides, as measured by the thermocouple, is controlled so that there is an increase in the range of 10–40° C., preferably about 25° C., by the time the evaporation is complete. Both heat sources are shut off immediately after all the material has evaporated and the apparatus is permitted to cool until the slide temperature falls below 150° C., at which time the film covered slides may be removed from the equipment. Magnetoresistive devices prepared by this method exhibit a resistance change in a 4700 gauss field of 60% to 150%, depending on the method used for shorting Hall voltages, as compared to 170% for the same material in bulk form.

Materials other than glass may be used for the substrate on which the film is deposited. However, the substrate material must be a good electrical insulator and must be able to withstand the high temperatures involved in producing the film. Ceramics such as steatite are suitable for use in carrying out the method of the invention.

Magnetoresistive films from other magentoresistive materials can be vapor deposited by use of the exemplified equipment, the specific example being given to guide those skilled in the art in the general principles and one practice of the invention. Likewise, the invention can be practiced in equipment differing from that specifically illustrated, as will be apparent to those skilled in the art from knowledge of the principles and steps herein taught. Thus, equivalent methods of heating the substrate and measuring or controlling the temperature and the temperature rise thereof are within the scope of the invention. Furthermore it is apparent that the invention described is not limited to devices wherein the Hall voltage is shorted out in order to maximize the magnetoresistive properties, and also may be used where the Hall voltage is modified, measured or even ignored in the operation of the device.

We claim as our invention:

1. A method of making devices having a thin film of Hall voltage material on a base plate, including the steps of: heating a base plate in a zone of reduced pressure to a predetermined elevated temperature not less than 55° C. below the melting temperature of said Hall voltage material; evaporating a quantity of Hall voltage material over a period of time in the reduced pressure zone; condensing at least a portion of the vaporized material on the base plate; raising the temperature of the base plate during said period of time; and cooling the base plate with the condensed film thereon at the end of said period of time.

2. A method of making devices having a thin film of magnetoresistive material on a base plate, including the steps of: heating a base plate in a zone of reduced pressure to a substantially elevated temperature not less than 55° C. below the melting temperature of said magnetoresistance material; evaporating a quantity of the magnetoresistive material in discrete portions over a period of time in the reduced pressure zone; condensing at least a portion of the vaporized material on the base plate; raising the temperature of the base plate during said period of time; and cooling the base plate with the condensed film thereon at the end of said period of time.

3. A method of making devices having a thin film of magnetoresistive material on a base plate, including the steps of: heating a base plate from one side thereof in a zone of reduced pressure to stabilize the temperature of the plate at a predetermined elevated magnitude not less than 55° C. below the melting temperature of said magnetoresistance material; flash evaporating a quantity of magnetoresistive material in discrete portions over a period of time in the reduced pressure zone; condensing at least a portion of the vaporized material on the other side of the base plate; raising the temperature of the base plate during said period of time; and cooling the base plate with the condensed film thereon at the end of said period of time.

4. A method of making devices having a thin film of magnetoresistive material on a base plate, including the steps of: heating a base plate in a zone of reduced pressure to stabilize the temperature of the plate at an elevated magnitude in the order of the melting temperature of indium antimonide; flash evaporating a quantity of indium antimonide in discrete portions over a period of time in the reduced pressure zone; condensing at least a portion of the vaporized material on the base plate; raising the temperature of the base plate during said period of time in the order of 10° to 40° C.; and cooling the base plate with the condensed film thereon at the end of said period of time.

5. A process for producing highly magnetoresistive films on a substrate, which process includes the steps of: subdividing a highly magnetoresistive material; dropping individual particles of the material onto a surface maintained at a temperature above the melting point of the material to vaporize the material while maintaining said surface and said substrate spaced from each other in a vacuum, the vaporized material condensing and depositing on said substrate as a film; and maintaining the substrate at a substantially elevated temperature not less than 55° C. below the melting temperature of said magnetoresistance material for producing a crystalline deposit of said material, said last-named temperature being only slightly less than said melting temperature.

6. A process as defined in claim 5 in which said substrate is the surface of a base member translucent to infrared radiation, and including the step of directing infrared radiation through said base member toward said substrate surface, the temperature of the substrate surface being at least in part the result of such infrared radiation.

7. A process as defined in claim 6 in which said deposited film is reflective of said infrared radiation and increases the temperature of said base member during the deposition by reflection back through this base member.

8. A process for producing highly magnetoresistive films on a substrate formed by a surface of a base member made of a substance of high electric resistivity, which process includes the steps of: heating said base member to a starting temperature within the range of about 470–530° C.; heating indium antimonide in a vacuum to a vaporizing temperature while spaced from said surface so that an initial portion of the resulting vapors move to said surface while said base member is at said starting temperature; raising the temperature of said base member to a value about 10–40° C. above said starting temperature during continued movement of said vapors to said surface; and subsequently cooling said base member and said film to produce a highly magnetoresistive film on said base member.

9. A process as defined in claim 8 in which said indium antimonide is heated to form said vapors by steps including the dropping of individual particles of indium antimonide onto a surface maintained in said vacuum spaced from the substrate surface and at a temperature of about 1100–1300° C.

10. A process for producing highly magnetoresistive films of a polycrystalline semiconductor material, which process includes the steps of: progressively vaporizing said material in vacuum in spaced relation to a substrate surface so that said vapors progressively move to said surface to deposit thereon; maintaining molten the surface of said deposit facing the vapors moving theretoward, said surface being maintained molten during the continued movement of such vapors by heating said substrate surface to a substantially elevated temperature not less than 55° C. below the melting temperature of said semiconductor material whereby a large part of said vapors reach and associate with said molten surface during the continued vaporization; stopping said vaporization when said deposit has produced a thin film; and cooling the filmed substrate.

11. A process as defined in claim 10 including the step of applying heat to said substrate during the progressive movement of said vapors to said molten surface.

12. A process as defined in claim 11 in which said substrate is glass and in which at least some of said heat is applied thereto by directing infrared rays in a direction through the glass toward the substrate surface.

13. A process for producing on a substrate surface a highly magnetoresistive film of a magnetoresistive compound formed of at least two elements, which process includes the steps of: heating the magnetoresistive compound under vacuum and at a position spaced from said substrate so as to form atoms of both of said elements which move through the vacuum to said substrate surface and combining same thereon to reproduce the compound while said substrate is at a temperature not less than 55° C. below the melting point of said compound, thus producing a film on said substrate surface; and cooling said film and said substrate surface to produce a magnetoresistive crystalline film.

14. A method of making devices having a thin film of a magnetoresistive, intermetallic compound on a base plate, including the steps of: heating the base plate in a zone of reduced pressure to an elevated temperature not less than 55° C. below the melting temperature of the compound; evaporating a quantity of the intermetallic compound in the reduced pressure zone with at least a portion of the vaporized elements directed toward the base plate; condensing the material impinging on the plate; raising the temperature of the base plate during said condensing for recombining a portion of the vaporized elements to produce the intermetallic compound resulting in a film which is a mixture of the compound and each of the elements of the compound; and cooling the film-coated base plate.

15. A method of making devices having a thin film of magnetoresistive material on a base, including the steps of: heating a base in a zone of reduced pressure to a predetermined elevated temperature not less than 55° C. below the melting temperature of said magnetoresistance material; evaporating a magnetoresistive material over a period of time in the reduced pressure zone; condensing at least a portion of the vaporized material on the base so that the temperature of the base increases from said predetermined elevated temprature during the period of time that said magnetoresistive material is evaporated; and cooling the base with the condensed film thereon at the end of said period of time.

16. A method of making devices having a thin film of magnetoresistive material on a base, including the steps of: heating a base in a zone of reduced pressure to a predetermined elevated temperature not less than 55° C. below the melting temperature of said magnetoresistance material; evaporating a magnetoresistive compound over a period of time in the reduced pressure zone so that said compound is separated into its individual atoms, condensing at least a portion of evaporizing compound on the base so that the atoms recombine and add heat to the base by heat of reaction and heat of condensation; and cooling the base with the condensed film thereon at the end of said period of time.

17. A method for producing a thin semiconductor layer of a semiconducting compound on a base plate, including the steps of: heating a base plate in a zone of reduced pressure to stabilize the temperature of the plate at an elevated magnitude; evaporating a quantity of a semiconducting compound over a period of time in the reduced pressure zone, said semiconducting compound being taken from the group consisting of indium arsenide and indium antimonide; condensing at least a portion of the vaporized material on the base plate; controlling the rise in the temperature of the base plate during said period of time to maintain said rise in the order of 10° to 40° C.; and cooling the base plate with the condensed film thereon at the end of said period of time.

18. A method for producing a thin semiconductor layer of a semiconducting compound on a base plate, including the steps of: heating a base plate in a zone of reduced pressure to a substantially elevated temperature not less than 55° C. below the melting temperature of said semiconducting compound; evaporating a quantity of said semiconducting over a period of time in the reduced pressure zone, said semiconducting compound being taken from the group consisting of indium arsenide and indium antimonide; condensing at least a portion of the vaporized material on the base plate; raising the temperature of the base plate during said period of time; and cooling the base plate with the condensed film thereon at the end of said period of time.

References Cited in the file of this patent

UNITED STATES PATENTS

| | | |
|---|---|---|
| 2,707,223 | Hollman | Apr. 26, 1955 |
| 2,828,396 | Forman et al. | Mar. 25, 1958 |
| 2,886,469 | Fitzer | May 12, 1959 |
| 2,898,234 | Nack et al. | Aug. 4, 1959 |
| 2,938,816 | Gunther | May 31, 1960 |

FOREIGN PATENTS

| | | |
|---|---|---|
| 1,057,845 | Germany | May 21, 1959 |

OTHER REFERENCES

Holland: "Vacuum Deposition of Thin Films," 1956, John Wiley and Sons, N.Y. (page 52 relied on).

Reimer: "Zeitschrift für Naturforschung," Band 13a, February 1958, Heft 2, pages 148–152 relied on.

Gunther: "Die Naturwissenschaften," vol. 45, No. 17, 1958, pages 415 and 416 relied on.

UNITED STATES PATENT OFFICE

CERTIFICATE OF CORRECTION

Patent No. 3,082,124 March 19, 1963

Barry T. French et al.

It is hereby certified that error appears in the above numbered patent requiring correction and that the said Letters Patent should read as corrected below.

Column 5, line 23, for ".003" read -- .0003 --; line 26, for "gausses" read -- gauss --; column 8, line 34, for "temprature" read --temperature --; line 46, for "evaporizing" read -- evaporized --; line 71, after "semiconducting" insert -- compound --.

Signed and sealed this 8th day of October 1963.

(SEAL)
Attest:

ERNEST W. SWIDER
Attesting Officer

EDWIN L. REYNOLDS
Acting Commissioner of Patents